United States Patent
Kim et al.

(10) Patent No.: US 8,017,961 B2
(45) Date of Patent: Sep. 13, 2011

(54) LIGHT EMITTING DEVICE AND PHOSPHOR OF ALKALINE EARTH SULFIDE THEREFOR

(75) Inventors: Kyung Nam Kim, Seoul (KR); Sang Mi Park, Seoul (KR); Tomizo Matsuoka, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 472 days.

(21) Appl. No.: 11/912,384

(22) PCT Filed: May 23, 2006

(86) PCT No.: PCT/KR2006/001923
§ 371 (c)(1),
(2), (4) Date: Oct. 23, 2007

(87) PCT Pub. No.: WO2006/126819
PCT Pub. Date: Nov. 30, 2006

(65) Prior Publication Data
US 2008/0191229 A1    Aug. 14, 2008

(30) Foreign Application Priority Data

May 24, 2005 (KR) .................. 10-2005-0043785
Jun. 30, 2005 (KR) .................. 10-2005-0057892

(51) Int. Cl.
*H01L 33/00* (2010.01)
(52) U.S. Cl. ............. 257/98; 257/E33.061; 252/301.4 R
(58) Field of Classification Search ............ 257/98, 257/E33.061, 88, E33.067; 252/301.4 R; 423/263, 508; 313/503
See application file for complete search history.

(56) References Cited

U.S. PATENT DOCUMENTS

| 2,110,162 A | 3/1938 | Leverenz |
| 2,402,760 A | 6/1946 | Leverenz |
| 4,065,688 A | 12/1977 | Thornton |

(Continued)

FOREIGN PATENT DOCUMENTS

CN    1584703    2/2005

(Continued)

OTHER PUBLICATIONS

The First Office Action issued Feb. 5, 2010 by the State Intellectual Property Office of the People's Republic of China in Chinese Patent Application No. 200680018490.1.

(Continued)

*Primary Examiner* — Thomas L Dickey
*Assistant Examiner* — Fazli Erdem
(74) *Attorney, Agent, or Firm* — H.C. Park & Associates, PLC

(57) ABSTRACT

The present invention relates to a light emitting device comprising a light emitting diode for emitting blue light or ultraviolet rays, and at least one orthosilicate based phosphor for emitting light in a green to yellow region and an alkaline earth metal sulfide based phosphor for emitting light in a red region which are installed above the light emitting diode.

According to the light emitting device of the present invention, white light with a continuous spectrum ranging from green to red can be implemented such that more excellent color rendering and color reproducibility can be obtained. Therefore, the light emitting device of the present invention can used in an liquid crystal display backlight unit as well as a general lighting source and flash light source.

17 Claims, 4 Drawing Sheets

U.S. PATENT DOCUMENTS

| | | | |
|---|---|---|---|
| 4,303,913 | A | 12/1981 | Tohda et al. |
| 4,563,297 | A | 1/1986 | Kukimoto et al. |
| 5,208,462 | A | 5/1993 | O'Connor et al. |
| 5,598,059 | A | 1/1997 | Sun |
| 5,656,888 | A | 8/1997 | Sun et al. |
| 6,252,254 | B1 * | 6/2001 | Soules et al. .................. 257/89 |
| 6,501,102 | B2 | 12/2002 | Mueller-Mach et al. |
| 6,521,915 | B2 | 2/2003 | Odaki et al. |
| 6,680,569 | B2 | 1/2004 | Mueller-Mach et al. |
| 6,686,691 | B1 | 2/2004 | Mueller et al. |
| 6,762,551 | B2 * | 7/2004 | Shiiki et al. .................. 313/503 |
| 6,783,700 | B2 | 8/2004 | Tian et al. |
| 6,809,347 | B2 | 10/2004 | Tasch et al. |
| 6,943,380 | B2 | 9/2005 | Ota et al. |
| 7,468,147 | B2 | 12/2008 | Shida et al. |
| 7,482,636 | B2 | 1/2009 | Murayama et al. |
| 7,608,200 | B2 | 10/2009 | Seto et al. |
| 2003/0020101 | A1 | 1/2003 | Bogner et al. |
| 2003/0076669 | A1 | 4/2003 | Itoh et al. |
| 2003/0228412 | A1 | 12/2003 | Chen |
| 2004/0051111 | A1 | 3/2004 | Ota et al. |
| 2004/0104391 | A1 | 6/2004 | Maeda et al. |
| 2004/0124758 | A1 | 7/2004 | Danielson et al. |
| 2005/0046334 | A1 | 3/2005 | Fujiwara |
| 2005/0123243 | A1 | 6/2005 | Steckl et al. |
| 2005/0135118 | A1 | 6/2005 | Takata |
| 2005/0224828 | A1 * | 10/2005 | Oon et al. .................. 257/99 |
| 2005/0236958 | A1 | 10/2005 | Wang et al. |
| 2005/0254258 | A1 | 11/2005 | Lee |
| 2005/0276074 | A1 | 12/2005 | Ryu |
| 2006/0081862 | A1 | 4/2006 | Chua et al. |
| 2006/0082296 | A1 | 4/2006 | Chua et al. |
| 2007/0090381 | A1 | 4/2007 | Otsuka et al. |
| 2007/0221938 | A1 | 9/2007 | Radkov et al. |
| 2007/0259206 | A1 | 11/2007 | Oshio |
| 2009/0066230 | A1 | 3/2009 | Hirosaki et al. |
| 2009/0218581 | A1 | 9/2009 | Schmidt et al. |
| 2009/0295272 | A1 | 12/2009 | Oshio |

FOREIGN PATENT DOCUMENTS

| | | |
|---|---|---|
| DE | 10028266 | 12/2001 |
| JP | 57-128772 | 8/1982 |
| JP | 2000-171796 | 6/2000 |
| JP | 2002-531956 | 6/2000 |
| JP | 2002-060747 | 2/2002 |
| JP | 2004-505172 | 2/2002 |
| JP | 2003-203504 | 7/2003 |
| JP | 2003-315796 | 11/2003 |
| JP | 2004-094031 | 3/2004 |
| JP | 2004-119375 | 4/2004 |
| JP | 2004-119743 | 4/2004 |
| JP | 2004-161807 | 6/2004 |
| JP | 2004-327492 | 11/2004 |
| JP | 2005-019997 | 1/2005 |
| JP | 2005-079500 | 3/2005 |
| JP | 2002-156531 | 5/2005 |
| JP | 2004-296830 | 2/2011 |
| KR | 10-2001-0097147 | 11/2001 |
| KR | 10-2001-0101761 | 11/2001 |
| KR | 10-2004-0000004 | 1/2004 |
| KR | 10-2005-0117165 | 12/2005 |
| KR | 10-2006-0028932 | 4/2006 |
| KR | 10-2006-0063586 | 6/2006 |
| KR | 10-0601200 | 7/2006 |
| KR | 10-2007-0002385 | 1/2007 |
| KR | 10-0700231 | 3/2007 |
| TW | 563261 | 11/2003 |
| WO | 98/05078 | 2/1998 |
| WO | 00/33390 | 6/2000 |
| WO | 01/24229 | 4/2001 |
| WO | WO 01/24229 * | 4/2001 |
| WO | 02/11173 | 2/2002 |
| WO | 03021691 | 3/2003 |
| WO | 03/081957 | 10/2003 |
| WO | 03080763 | 10/2003 |
| WO | 2004-007636 | 1/2004 |
| WO | 2005/026285 | 3/2005 |
| WO | 2005/1068584 | 7/2005 |
| WO | 2006-126817 | 11/2006 |

OTHER PUBLICATIONS

Non-Final Office Action of U.S. Appl. No. 12/904,219 issued on Mar. 3, 2011.
Non-Final Office Action of U.S. Appl. No. 11/912,383 issued on Mar. 29, 2011.
Philippot et al, "relation between properties and structural Evolution of Some si, Ge, Sn Ternary Chalogenides", React. Solids 8th Meeting, 1976, pp. 535-539.
European Search Report of EP06768577.6 issued on Jan. 20, 2011, corresponding to U.S. Appl. No. 11/912,384.
Final Office Action of U.S. Appl. No. 11/948,813 issued on Dec. 8, 2010.
Non-Final Office Action of U.S. Appl. No. 11/948,813 issued on Aug. 18, 2010.
Non-Final Office Action of U.S. Appl. No. 12/306,664 issued on Feb. 1, 2011.
"TW Preliminary Notice of First Office Action of Taiwan Application No. 09820622730 Dated Oct. 2, 2009, corresponding to U.S. Appl. No. 11/912,383."
"Communication with Supplementary European Search Report of EP 06 76 8575 dated Aug. 4, 2010, corresponding to U.S. Appl. No. 11/912,383."
"International Search Report of PCT/KR2006/001921 dated Aug. 31, 2006, corresponding to U.S. Appl. No. 11/912,383."
Non-Final Office Action of U.S. Appl. No. 11/912,383 issued on Jun. 29, 2010.
Non-Final Office Action of U.S. Appl. No. 11/912,383 issued on Nov. 10, 2010.
Notice of Allowance of U.S. Appl. No. 11/912,383 issued on Feb. 23, 2011.
Chinese Office Action of Chinese Application No. 2006800103321 dated Aug. 29, 2008, corresponding to U.S. Appl. No. 11/909,700.
International Search Report of PCT/KR2006/000885 dated on Jun. 21, 2006, corresponding to U.S. Appl. No. 11/909,700.
Written Opinion of PCT/KR2006/000885 dated on Jun. 21, 2006, corresponding to U.S. Appl. No. 11/909,700.
Non-Final Office Action of U.S. Appl. No. 11/909,700 issued on Jun. 3, 2010.
Notice of Allowance of U.S. Appl. No. 11/909,700 issued on Nov. 30, 2010.
E. Philippot et al., "Relation Between properties and structural evolution of some Si, Ge Sn Ternary chalogenides", (1997), React, Solids [Proc. Int. Symp.]. 8th, Meeting date 1976, pp. 535-539, corresponding to U.S. Appl. No. 11/913,538.
Baur et al. "White Light Emitting Diodes", (1998), Adv. Solid State Phys., vol. 67, pp. 67-78, corresponding to U.S. Appl. No. 11/913,538.
International Search Report of PCT/KR2006/002330 dated on Oct. 9, 2006, corresponding to U.S. Appl. No. 11/913,538.
Non-Final Office Action of U.S. Appl. No. 11/913,538 issued on Nov. 25, 2008.
Final Office Action of U.S. Appl. No. 11/913,538 issued on Apr. 17, 2009.
Non-Final Office Action of U.S. Appl. No. 11/913,538 issued on Jul. 31, 2009.
Final Office Action of U.S. Appl. No. 11/913,538 issued on Mar. 25, 2010.
Notice of Allowance of U.S. Appl. No. 11/913,538 issued on Jul. 23, 2010.
European Search Report dated Apr. 26, 2011 for EP Application No. 11151900.5.

* cited by examiner

US 8,017,961 B2

LIGHT EMITTING DEVICE AND PHOSPHOR OF ALKALINE EARTH SULFIDE THEREFOR

TECHNICAL FIELD

The present invention relates to a light emitting device and a phosphor therefor. More specifically, the present invention relates to a light emitting device which can be used as a liquid crystal display(LCD) backlight unit due to its excellent color reproducibility as well as a general lighting source or flash due to its improved color reproduction range, and an alkaline earth metal sulfide based phosphor therefor.

BACKGROUND ART

A light emitting diode (LED) is a photoelectric conversion semiconductor device in which an N type semiconductor and a P type semiconductor are joined together, and emits light through recombination of electrons and holes.

Light emitting diodes include a red LED using GaAsP or the like, a green LED using GaP or the like, a blue LED using an InGaN/AlGaN double hetero structure, and the like.

This light emitting diode is packaged and then used in manufacturing a variety of light emitting devices. The light emitting device manufactured from the packaged light emitting diodes has characteristics of low power consumption, a long lifespan, installation in a narrow space, and strong resistance against vibration. In recent years, white LEDs in addition to single color LEDs, e.g. red, blue or green LEDs, have been placed on the market. As the white LEDs are applied to products for automobiles and illumination, it is expected that their demands will be rapidly increased.

In light emitting diode technologies, the methods of implementing white color can be roughly classified into two types. The first one is a method in which red, blue and green LEDs are arranged to be adjacent to one another and colors of light emitted from the respective devices are mixed to implement white light. However, since the respective light emitting diodes have different thermal or temporal characteristics, there are problems in that uniform light mixing cannot be obtained due to changes in a color tone according to usage environment, particularly, the occurrence of color spots, or the like, and thus, the brightness is not sufficiently high. Further, the circuit configurations for operating the respective light emitting diodes are complex, and it is difficult to implement perfect white light since it is difficult to obtain optimal conditions for mixing three color lights depending on the positions of the light emitting diodes due to the package configurations. Moreover, since its Color Rendering Index (CRI) is as low as about 40, it is not suitable for the general lighting source or the flash.

The second one is a method in which a phosphor is disposed on a light emitting diode, and the color of a portion of primary light emitted from the light emitting diode and the color of secondary light of which wavelength has been converted by the phosphor are mixed to implement white light. For example, to a light emitting diode for emitting blue light is attached a phosphor that emits yellowish green or yellow using a portion of the blue light of the light emitting diode as an excitation source, so that white light can be obtained by mixing the blue light emitted from the light emitting diode and the yellowish green or yellow light emitted from the phosphor. Alternatively, on a light emitting diode for emitting ultraviolet rays may be applied a phosphor that absorbs the emitted ultraviolet rays and emits visible light ranging from blue to red in order to obtain white color.

In order to obtain white light emission, the blue LED with a wavelength of 450 to 470 nm and the yellow phosphor such as YAG:Ce or $(Ba,Sr,Ca)_2SiO_4$:Eu may be generally used. The blue light source causes the yellow phosphor to be excited and then to emit yellow light and, and thus, white light can be obtained by mixing the blue and yellow lights.

DISCLOSURE OF INVENTION

Technical Problem

However, there is a problem in that such a light emitting device has low color rendering, which is typically measured using the Color Rendering Index (CRI), due to the shortages of green and red spectra. That is, in a case where the white light emitting device obtained through the combination of the blue LED and the yellow phosphor is used as a general lighting source and particularly a flash light source for photographing, there may occur a color distortion phenomenon in which original colors of respective objects cannot be sufficiently expressed.

Further, in a case where the light emitting device is used as an LCD backlight white light source, the color reproduction range which can be expressed after the white light has been transmitted through RGB filters becomes considerably narrow. As a result, there is a limitation in implementing images closer to natural colors.

Technical Solution

The present invention is conceived to solve the aforementioned problem in the prior art. Accordingly, an object of the present invention is to provide a light emitting device in which at least one orthosilicate based phosphor for emitting light with wavelength bands of a green to yellow region and an alkaline earth metal sulfide based phosphor for emitting light with a wavelength band of a red region are provided above the LED for emitting blue light or ultraviolet rays, so that the light emitting device can emit the white light with excellent color rendering and thus can be used as a general lighting source or flash, and an alkaline earth metal sulfide based phosphor for use in the light emitting device.

Another object of the present invention is to provide a light emitting device for use in an LCD backlight unit wherein its color reproduction range can be improved by a maximum of about 40% as compared with conventional white light emitting devices composed of the blue LED and the yellow light emitting phosphor.

According to an aspect of the present invention for achieving objects, there is provided a light emitting device, comprising a light emitting diode for emitting blue light, and at least one orthosilicate based phosphor for emitting light in a green to yellow region and an alkaline earth metal sulfide based phosphor for emitting light in a red region which are installed above the light emitting diode.

Preferably, the orthosilicate based phosphor has a chemical formula of $a(M^IO).b(M^{II}O).c(M^{III}A).d(M^{III}_2O).e(M_{IV2}O_3).f(M^V_oO_p).g(SiO_2).h(M^{VI}_xO_y)$, wherein $M^I$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^V$ is at least one element selected from the group consisting of Ge, V, Nd, Ta, W, Mo, Ti, Zr and Im; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$, and $1 \leq y \leq 5$.

More preferably, the orthosilicate based phosphor has a chemical formula of $((Br,Sr,Ca)_{1-x}(Pb,Cu)_x)_2SiO_4:Eu,B$; wherein B is at least one element selected from the group consisting of Bi, Sn, Sb, Sc, Y, La, Ce, Pr, Nd, Pm, Sm, Gd, Tb, Dy, Ho, Er, Tm, Yb and Lu; x is set in a range of 0 to 1; and Eu and B are set in ranges of 0 to 0.2.

The orthosilicate based phosphor may emit light with a wavelength of 505 nm to 605 nm depending on compositions of the phosphor.

Preferably, the alkaline earth metal sulfide based phosphor has a chemical formula of $(Ca,Sr)_{1-x-y}Eu_xC_y(S_{1-z}Se_z)$, wherein C is at least one element selected from the group consisting of Mn and Pb; x is set in a range of 0.0005 to 0.1; y is set in a range of 0 to 0.5; and z is set in a range of 0 to 1.

More preferably, the alkaline earth metal sulfide based phosphor has a chemical formula of $(Ca,Sr)_{1-x-y}Eu_xPb_yS$, wherein x is set in a range of 0.0005 to 0.01; and y is set in a range of 0 to 0.5.

The alkaline earth metal sulfide based phosphor may emit light with a wavelength of 600 nm to 660 nm.

Preferably, the alkaline earth metal sulfide based phosphor has a chemical formula of $A_{x-a}Eu_aGeS_z$, wherein A is at least one element selected from the group consisting of Ca and Sr; $z=x+2$; x is set in a range of 2 to 5; and a/x is set in a range of 0.0005 to 0.02.

Preferably, an orthosilicate based phosphor for emitting light in a green region and an alkaline earth metal sulfide based phosphor for emitting light in a red region are installed above the light emitting diode.

The light emitting diode may emit light with a wavelength of 420 nm to 480.

Preferably, the light emitting device may further comprise a body and a molding portion for sealing the light emitting diode mounted on the body, wherein the orthosilicate based phosphor and the alkaline earth metal sulfide based phosphor are mixed and distributed in the molding portion. Herein, the body may be one of a substrate, a heat sink and a lead terminal.

The light emitting device may further comprise a ultraviolet light emitting diode for emitting ultraviolet rays, wherein at least one of the orthosilicate based phosphor and the alkaline earth metal sulfide based phosphor is excited by light emitted from the ultraviolet light emitting diode to emit light.

According to another aspect of the present invention, there is provided a light emitting device, comprising a light emitting diode for emitting blue light, and at least one orthosilicate based phosphor for emitting light in a green to yellow region and an alkaline earth metal sulfide based phosphor for emitting light in a red region which are installed above the light emitting diode, whereby its color rendering is improved in such a degree that the light emitting device can be used for a general lighting source or flash.

According to a further aspect of the present invention, there is provided a light emitting device, comprising a light emitting diode for emitting blue light, and at least one orthosilicate based phosphor for emitting light in a green to yellow region and an alkaline earth metal sulfide based phosphor for emitting light in a red region which are installed above the light emitting diode, whereby its color reproduction range is improved in such a degree that the light emitting device can be used for a LCD backlight unit.

According to a still further aspect of the present invention, there is provided an alkaline earth metal sulfide phosphor having a chemical formula, $(Ca,Sr)_{1-x-y}Eu_xC_y(S_{1-z}Se_z)$, wherein C is at least one element selected from the group consisting of Mn and Pb; x is set in a range of 0.0005 to 0.1; y is set in a range of 0 to 0.5; and z is set in a range of 0 to 1.

Preferably, the alkaline earth metal sulfide based phosphor has a chemical formula of $(Ca,Sr)_{1-x-y}Eu_xPb_yS$, wherein x is set in a range of 0.0005 to 0.01; and y is set in a range of 0 to 0.5.

Advantageous Effect

According to the present invention, a light emitting device includes an orthosilicate based phosphor and an alkaline earth metal sulfide based phosphor such that green, yellow, and red lights with excellent color rendering and reproducibility can be emitted under the excitation of light in a long wavelength ultraviolet region and blue region. Therefore, there is an advantage in that the light emitting device of the present invention can be applied to a variety of application fields in which the light in the long wavelength ultraviolet region and the blue region may be used as an energy source, such as for the green, red, and white light emitting devices when using an ultraviolet light emitting diode and for the bluelagoon, pink, and white light emitting devices when using blue light emitting diode.

In particular, at least one orthosilicate based phosphor for emitting light with wavelength bands of a green to yellow region and an alkaline earth metal sulfide based phosphor for emitting light with a red wavelength band are distributed together over the blue light emitting diode so that white light with a continuous spectrum ranging from green to red can be implemented to provide a white light emitting device with excellent color rendering. Since the light emitting device of the present invention can implement the white light with a high CRI of at least 90, there is another advantage in that the light emitting device of the present invention can be used as a flash light source as well as a general lighting source.

Further, the light emitting device of the present invention can be used as an LCD backlight source due to its excellent color reproducibility.

BEST MODE FOR CARRYING OUT THE INVENTION

Figure 1:
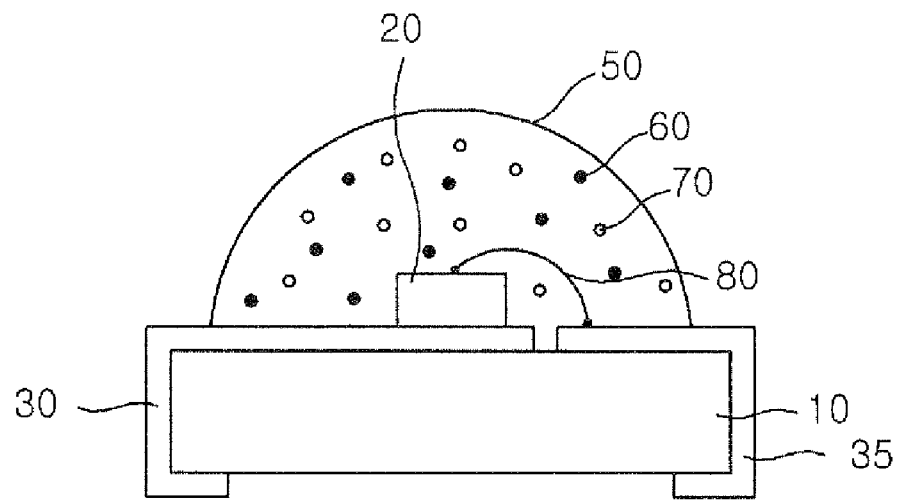
FIG. 1 is a sectional view showing a chip-type light emitting device according to the present invention.

Hereinafter, a light emitting device according to the present invention will be described in detail with reference to the accompanying drawings. However, the present invention is not limited to a preferred embodiment set forth herein but can be implemented in different forms. Rather, the preferred embodiment is merely provided to allow the present invention to be completely described herein and to fully convey the scope of the invention to those skilled in the art. In the drawings, like elements are designated by the same reference numerals.

The light emitting device of the present invention comprises at least one orthosilicate based phosphor for emitting light with a wavelength band in a green to yellow region and an alkaline earth metal sulfide based phosphor for emitting light with a red wavelength band such that green, yellow, and red lights with excellent color rendering and reproducibility can be emitted under the excitation of light in a long wavelength ultraviolet region and blue region.

The orthosilicate based phosphor has a structure as represented by a chemical formula (1):

$$a(M^I O).b(M^{II} O).c(M^{III} A).d(M^{III}_2 O).e(M^{IV}_2 O_3).f(M^V_o O_p).g(SiO_2).h(M^{VI}_x O_y) \quad \text{[formula 1]}$$

In the chemical formula (1), $M^I$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^V$ is at least one element selected from the group consisting of Ge, V, Nd, Ta, W, Mo, Ti, Zr and Hf; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; and A is at least one element selected from the group consisting of F, Cl, Br and I.

Further, in the chemical formula (1), a, b, c, d, e, f, g, h, o, p, x and y are set in the ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \geq o \geq 2$, $1 \leq p \leq 5$, $1 \leq x \leq 2$, and $1 \leq y \leq 5$.

Preferably, the orthosilicate based phosphor is expressed as the following chemical formula (2):

$$((Br,Sr,Ca)_{1-x}(Pb,Cu)_x)_2 SiO_4:Eu,B \quad \text{[formula 2]}$$

In the chemical formula (2), B is at least one element selected from the group consisting of Bi, Sn, Sb, Sc, Y, La, Ce, Pr, Nd, Pm, Sm, Gd, Tb, Dy, Ho, Er, Tm, Yb and Lu. Further, x is set in the range of 0 to 1; and Eu and B are set in the ranges of 0 to 0.2.

The typical composition of the orthosilicate based phosphor can be expressed as the following chemical formulas (3) to (5):

$$Pb_{0.1}Ba_{0.95}Sr_{0.95}SiO_4:Eu \quad \text{[formula 3]}$$

$$Cu_{0.05}Sr_{1.7}Ca_{0.25}SiO_4:Eu \quad \text{[formula 4]}$$

$$Cu_{0.1}Ba_{0.1}Sr_{0.9}Ca_{0.9}SiO_4:Eu \quad \text{[formula 5]}$$

The phosphor expressed as the chemical formula (3) emits light with a wavelength of 527 nm, the phosphor expressed as the chemical formula (4) emits light with a wavelength of 592 nm, and the phosphor expressed as the chemical formula (5) emits light with a wavelength of 605 nm. As such, the wavelength of the light emitted from the orthosilicate based phosphor can be controlled depending on its elements and compositions.

Further, the alkaline earth metal sulfide based phosphor has a structure as expressed in the following chemical formula (6):

$$(Ca,Sr)_{1-x-y}Eu_x C_y (S_{1-z}Se_z) \quad \text{[formula 6]}$$

In the chemical formula (6), C is at least one element selected from the group consisting of Mn and Pb. Further, x is set in the range of 0.0005 to 0.1, y is set in the range of 0 to 0.5, and z is set in the range of 0 to 1.

Preferably, the alkaline earth metal sulfide based phosphor has a structure as expressed in the chemical formula (7):

$$(Ca,Sr)_{1-x-y}Eu_x Pb_y S \quad \text{[formula 7]}$$

In the chemical formula (7), x is set in the range of 0.0005 to 0.01, and y is set in the range of 0 to 0.5.

The typical composition of the alkaline earth metal sulfide based phosphor may be expressed as the following chemical formulas (8) to (10):

$$Ca_{0.947}Pb_{0.05}Eu_{0.003}S \quad \text{[formula 8]}$$

$$Ca_{0.447}Sr_{0.5}Pb_{0.05}Eu_{0.003}S \quad \text{[formula 9]}$$

$$Ca_{0.897}Pb_{0.1}Eu_{0.003}S \quad \text{[formula 10]}$$

The phosphor expressed as the chemical formula (8) emits light with a wavelength of 650 nm, the phosphor expressed as the chemical formula (9) emits light with a wavelength of 630 nm, and the phosphor expressed as the chemical formula (10) emits light with a wavelength of 648 nm. As such, the wavelength of the light emitted from the alkaline earth metal sulfide based phosphor can be controlled depending on its elements and compositions.

Excellent green, yellow, and red lights may be implemented under the excitation of light in the long wavelength ultraviolet region and the blue region by using the aforementioned phosphors according to the present invention. In case of an ultraviolet LED, the aforementioned phosphors may be used separately or together to implement various colors such as green, red and white colors. Alternatively, in case of a blue LED, the aforementioned phosphors may be used separately or together to implement various colors such as bluelagoon, pink, and white colors.

Hereinafter, the light emitting device in which the aforementioned phosphors are used according to the present invention will be described with reference to the accompanying drawings.

FIG. 1 is a sectional view showing a chip-type light emitting device according to the present invention.

Referring to this figure, the light emitting device comprises a substrate 10, first and second electrodes 30 and 35 formed on the substrate 10, a light emitting diode 20 mounted on the first electrode 30, and a molding portion 50 for sealing the light emitting diode 20. At least one orthosilicate based phosphor 60 and an alkaline earth metal sulfide based phosphor 70 as described above are uniformly distributed in the molding portion 50.

The substrate 10 may be formed with a predetermined groove around its central region in which the light emitting diode 20 is mounted. At this time, the groove may be formed in such a manner that a sidewall surface thereof can be inclined at a predetermined slope. Here, since the light emitting diode 20 is mounted on a bottom surface of the groove, the sidewall surface with a predetermined inclination allows the light emitted from the light emitting diode 20 to be maximally reflected such that its luminous efficiency can be increased.

The first and the second electrodes 30 and 35 are electrodes which are formed on the substrate 10 and connected to anode and cathode terminals of the light emitting diode 20, respectively. The first and the second electrodes 30 and 35 may be formed by using a printing technique. The first and the second electrodes 30 and 35 are made of a metallic material such as copper or aluminum with excellent conductivity and configured to be electrically disconnected from each other.

The light emitting diode 20 is a GaN, InGaN, AlGaN or AlGaInN based blue light emitting diode. In the present embodiment, a light emitting diode for emitting blue light in the range of 420 to 480 nm is used. However, the present invention is not limited thereto but may further include a light emitting diode for emitting ultraviolet rays in the range of 250 to 410 nm as well as the blue light. Only one light emitting diode may be used, or a plurality of light emitting diodes may be used if desired.

The light emitting diode 20 is mounted on the first electrode 30 and electrically connected to the second electrode 35 through a wire 80. Alternatively, in a case where the light emitting diode 20 is not mounted on the first electrode 30 or the second electrode 35 but formed on the substrate 10, it can be connected to the first and second electrodes 30 and 35 through two wires 80, respectively.

Further, the molding portion 50 for sealing the light emitting diode 20 is formed on the substrate 10. As described above, at least one orthosilicate based phosphor 60 and an alkaline earth metal sulfide based phosphor 70 are uniformly distributed in the molding portion 50. The molding portion 50 may be formed through an injection process using a mixture of a predetermined transparent epoxy resin and the aforementioned phosphors 60 and 70. Alternatively, the molding portion 50 may be formed in such a manner that it is manufactured using a separate mold and then pressurized or heat treated. The molding portion 50 may be formed into various shapes such as an optical lens type, a flat plate type, and a type in which unevenness is formed on its surface.

In such a light emitting device according to the present invention, primary light is emitted from the light emitting diode 20 and allows the phosphors 60 and 70 to emit secondary lights each having converted wavelength such that color in a desired spectrum region can be implemented through the mixing of the primary and secondary lights. That is, the blue light is emitted from the blue light emitting diode and causes the orthosilicate based phosphor to emit green to yellow light and the alkaline earth metal sulfide based phosphor to emit red light. Thus, a portion of the blue light, i.e. the primary light, may be mixed with the green, yellow and red lights, i.e. the secondary lights, to implement white light. Accordingly, the light emitting device of the present invention can implement the white light with a continuous spectrum ranging from green to red such that its color rendering can be improved.

Figure 2:
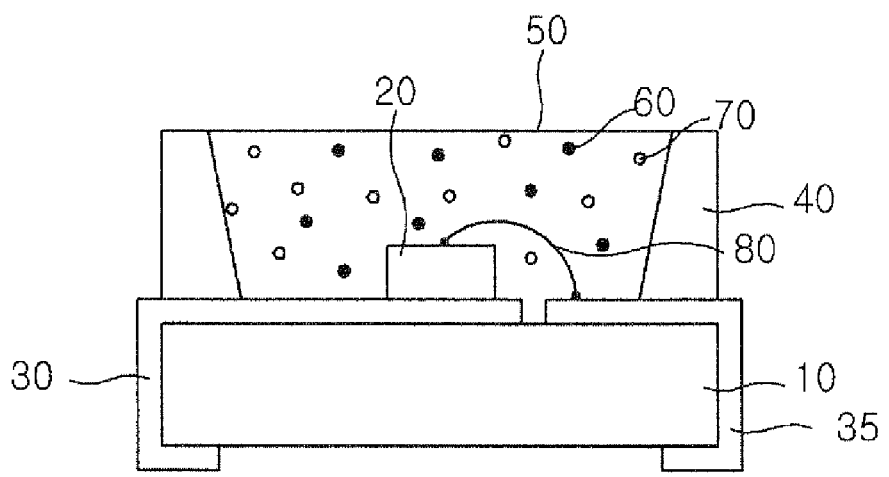
FIG. 2 is a sectional view showing a top-type light emitting device according to the present invention.

FIG. 2 is a sectional view showing a top-type light emitting device according to the present invention.

Referring to this figure, the light emitting device comprises a substrate 10, first and second electrodes 30 and 35 formed on the substrate 10, and a light emitting diode 20 mounted on the first electrode 30. Such a configuration is almost identical with that of the chip-type light emitting device, and accordingly, detailed descriptions thereof will be replaced with those described above with reference to FIG. 1. However, the top-type light emitting device comprises a reflector 40 formed on the substrate 10 to encompass the light emitting diode 20, and a molding portion 50 filled into a central space of the reflector 40 for protecting the light emitting diode 20.

In order to improve light brightness and light collecting capability, an inner sidewall of the reflector 40 which encompasses the light emitting diode can be formed to have a predetermined inclination. Such a configuration is preferable to maximize the reflection of light emitted from the light emitting diode 20 and to improve the luminous efficiency.

At least one orthosilicate based phosphor 60 and an alkaline earth metal sulfide based phosphor 70 are uniformly distributed in the molding portion 50. Accordingly, the primary light emitted from the light emitting diode 20 is mixed with the secondary lights each having the converted wavelength from the orthosilicate based phosphor 60 or the alkaline earth metal sulfide based phosphor 70 to implement the color in a desired spectrum range.

Figure 3:
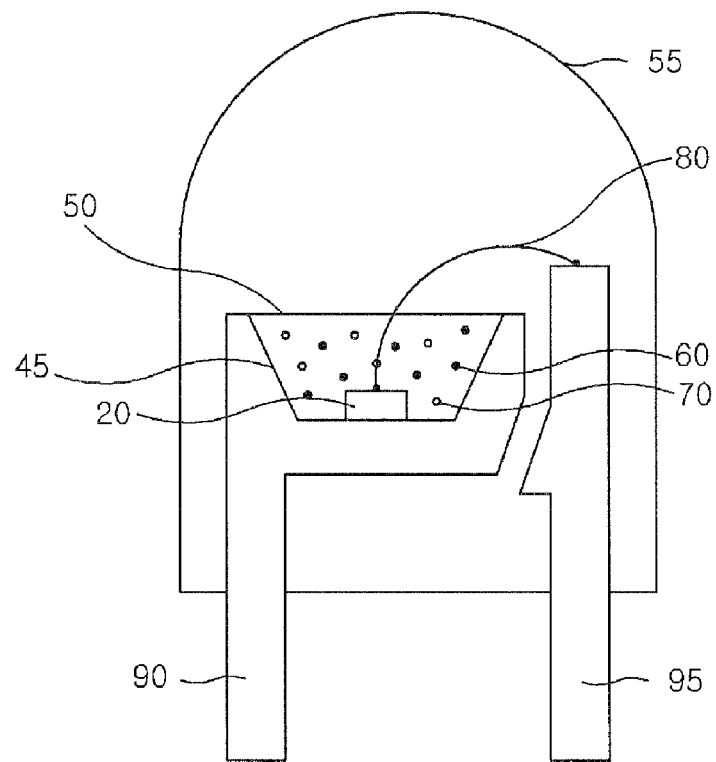
FIG. 3 is a sectional view showing a lamp-type light emitting device according to the present invention.

FIG. 3 is a sectional view showing a lamp-type light emitting device according to the present invention.

Referring to this figure, the light emitting device comprises a first lead terminal 90 with a reflecting portion 45 formed therein, and a second lead terminal 95 spaced apart from the first lead terminal 90 by a predetermined interval. A light emitting diode 20 is mounted onto the reflecting portion 45 of the first lead terminal 90 and electrically connected to the second lead terminal 95 through a wire 80. A molding portion 50 containing orthosilicate based and alkaline earth metal sulfide based phosphors 60 and 70 is formed on the light emitting diode 20. An outer peripheral molding portion 55 manufactured through a mold is formed on front ends of the first and second lead terminals 90 and 95. In the molding portion 50 are uniformly distributed at least one orthosilicate based phosphor 60 and an alkaline earth metal sulfide based phosphor 70, which absorb light emitted from the light emitting diode 20 to convert the absorbed light into light with respective wavelength. The outer peripheral molding portion 55 is made of a transparent epoxy resin to improve the transmittance of light emitted from the light emitting diode 20.

Figure 4:
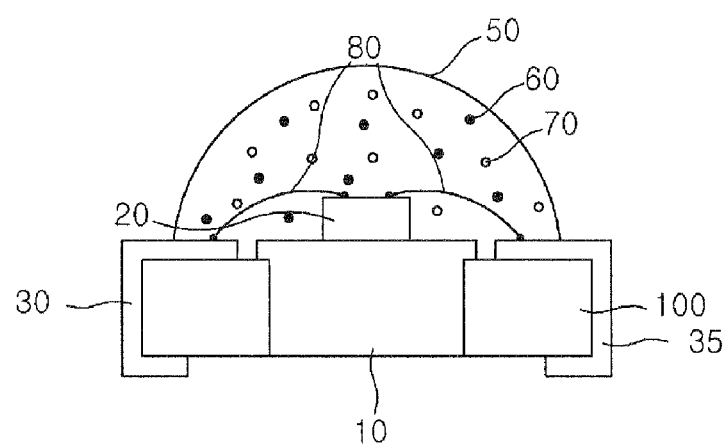
FIG. 4 is a sectional view showing a light emitting device including a housing according to the present invention.

FIG. 4 is a sectional view showing a light emitting device including a housing according to the present invention.

Referring to this figure, the light emitting device comprises a housing 100 formed with first and second electrodes 30 and 35 on both sides thereof and formed with a through hole, a substrate 10 mounted into the through hole of the housing 100, and a light emitting diode 20 mounted on the substrate 10. At this time, the substrate 10 may be formed of a certain material with excellent thermal conductivity to serve as a heat sink such that heat output from the light emitting diode 20 can be more effectively released. The light emitting device further includes a molding portion 50 for sealing the light emitting diode 20. Further, in the molding portion 50 are uniformly distributed at least one orthosilicate based phosphor 60 and an alkaline earth metal sulfide based phosphor 70 as described above.

The first and the second electrodes 30 and 35 are configured to be connected to anode and cathode terminals of the light emitting diode 20, respectively. The light emitting diode 20 is mounted on the substrate 10 and electrically connected to the first or second electrode 30 or 35 through the wires 80.

As described above the present invention may be applied to articles with various structures, and the technical features of the present invention are not limited to the aforementioned embodiments but may be modified or changed in various ways.

Figure 5:
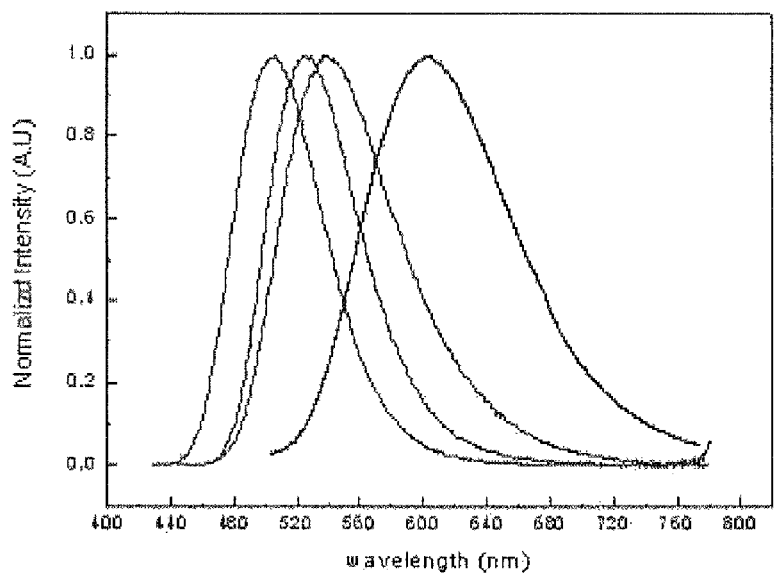
FIG. 5 is a graph illustrating emission spectra depending on the compositions of an orthosilicate based phosphor used in the light emitting device of the present invention.

FIG. 5 is a graph illustrating emission spectra depending on the compositions of an orthosilicate based phosphor used in the light emitting device of the present invention. As shown in the figure, the wavelength peak of the emitted light can be controlled in a range of from 505 nm to 605 nm depending on the composition of a host material and the concentration of a light-emitting central element, and excellent emission spectra can also be exhibited.

Figure 6:
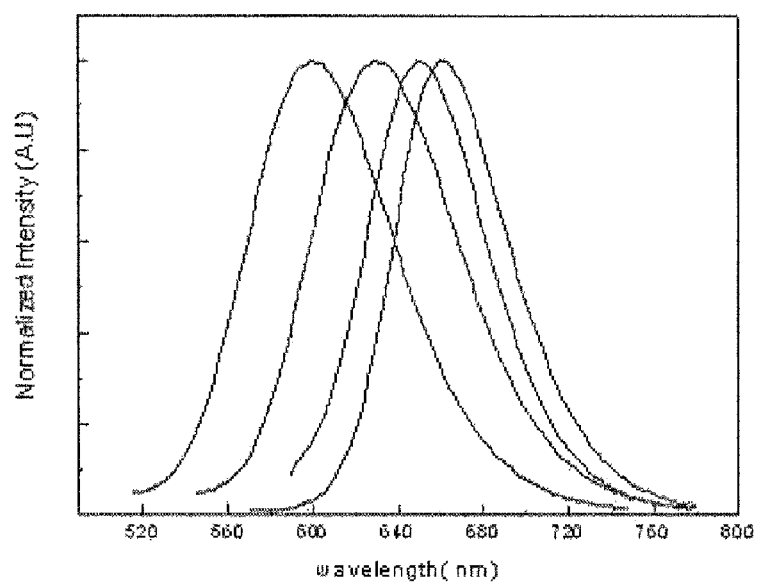
FIG. 6 is a graph illustrating emission spectra depending on the compositions of an alkaline earth metal sulfide based phosphor used in the light emitting device of the present invention.

FIG. 6 is a graph illustrating emission spectra depending on the compositions of an alkaline earth metal sulfide based phosphor used in the light emitting device of the present invention. As shown in the figure, the wavelength peak of the emitted light can be controlled in a range of from 600 nm to 660 nm depending on the composition of a host material and the concentration of a light-emitting central element, and excellent emission spectra can also be exhibited.

Figure 7:
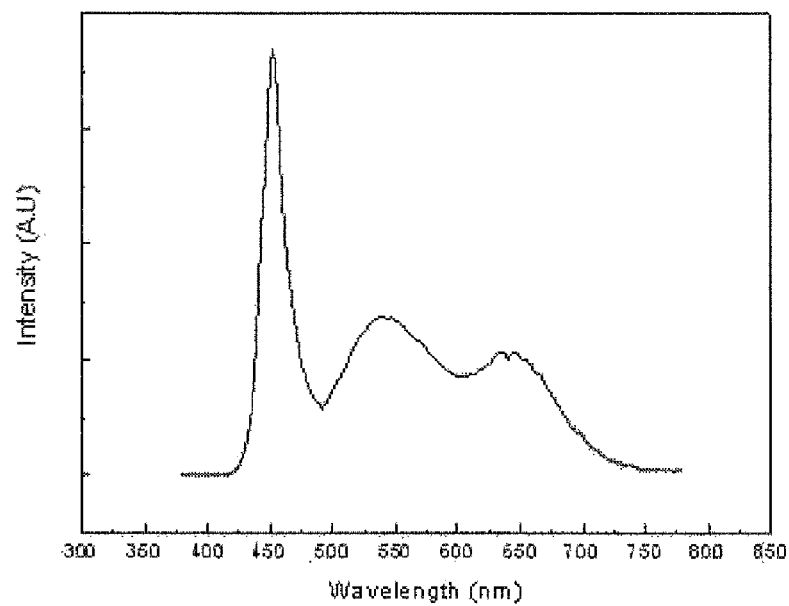
FIG. 7 is a graph illustrating emission spectra of the light emitting device of the present invention.

FIG. 7 is a graph illustrating an emission spectrum of the light emitting device of the present invention using the blue light emitting diode and the two kinds of orthosilicate based phosphor and one alkaline earth metal sulfide based phosphor. As the aforementioned phosphors, $(Ba_{0.45}Sr_{0.45}Pb_{0.1})_2SiO_4$:Eu with an emission wavelength of 515 nm, $(Sr_{0.795}Ba_{0.2}Pb_{0.005})_2SiO_4$:Eu with an emission wavelength of 565 nm, and $Ca_{0.897}Pb_{0.1}Eu_{0.003}S$ with an emission wavelength of 650 nm were used.

Referring to the figure, it can be noted that the primary light emitted from the blue light emitting diode is mixed with the secondary lights, i.e. green, yellow and red lights emitted from the phosphors excited by a portion of the primary light such that white light can be implemented. Accordingly, the color rendering of the present invention can be further improved as compared with the conventional white light emitting device which uses the blue light emitting diode and the yellow phosphor.

Figure 8:
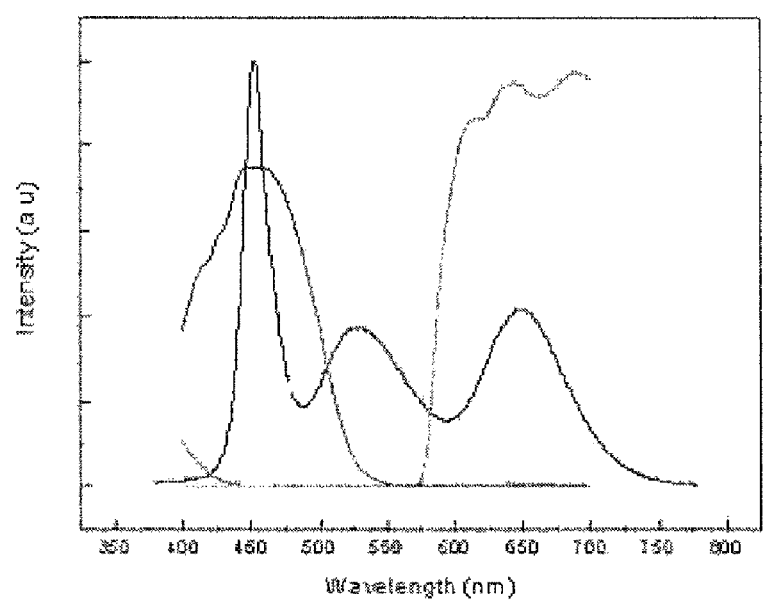
FIG. 8 is a graph illustrating the light emission spectra of the light emitting device together with the transmittance of a conventional LCD color filter.

FIG. 8 is a graph illustrating emission spectra of the light emitting device of the present invention using the blue light emitting diode and one kind of orthosilicate based phosphor and one alkaline earth metal sulfide based phosphor, in addition to transmittance of a conventional LCD color filter. As the aforementioned phosphors, $(Ba_{0.45}Sr_{0.45}Pb_{0.1})_2SiO_4$:Eu with an emission wavelength of 515 nm and $Ca_{0.897}Pb_{0.1}Eu_{0.003}S$ with an emission wavelength of 650 nm can be used.

Referring to the figure, it can be noted that the primary light emitted from the blue light emitting diode is mixed with the secondary lights, i.e. green and red lights emitted from the phosphors excited by a portion of the primary light such that white light can be implemented. Accordingly, the color reproduction range of the present invention can be further improved as compared with the conventional white light emitting device.

The present invention has been described with reference to the preferred embodiment and various specific modified embodiments. However, it may be understood to those skilled in the art that other specific embodiments different from the embodiments as specifically described above are also included within the scope and sprit of the present invention.

For example, it has been described in the embodiment of the present invention that when intending to implement a light emitting device comprising a blue or ultra-violet light emitting diode and at least one orthosilicate based phosphor for emitting green to yellow light and an alkaline earth metal sulfide based phosphor for emitting red light above the blue light or ultra-violet light emitting diode, the alkaline earth metal sulfide based phosphor has a chemical formula of $(Ca,Sr)_{1-x-y}Eu_xC_y(S_{1-z}Se_z)$ wherein C is at least one element selected from the group consisting of Mn and Pb, x is set in the range of 0.0005 to 0.1, y is set in the range of 0 to 0.5, and z is set in the range of 0 to 1.

As an a modified embodiment, however, the alkaline earth metal sulfide based phosphor may have a chemical formula of $A_{x-a}Eu_aGeS_z$, wherein A is at least one element selected from the group consisting of Ca and Sr, z=x+2, x is set in the range of 2 to 5, and a/x is set in the range of 0.0005 to 0.02.

The invention claimed is:

1. A light emitting device, comprising:
   a light emitting diode to emit blue light;
   at least one orthosilicate based phosphor to emit light in a green to yellow region; and
   an alkaline earth metal sulfide based phosphor to emit light in a red region,
   wherein the at least one orthosilicate based phosphor and the alkaline earth metal sulfide based phosphor are disposed on the light emitting diode,
   wherein the orthosilicate based phosphor comprises $a(M^IO).b(M^{II}O).c(M^{III}A).d(M^{III}_2O).e(M^{IV}_2O_3).f(M^V_oO_p).g(SiO_2).h(M^{VI}_xO_y)$, wherein $M^I$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^V$ is at least one element selected from the group consisting of Ge, V, Nd, Ta, W, Mo, Ti, Zr and Hf; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in ranges of $0<a\leq2$, $0\leq b\leq8$, $0\leq c\leq4$, $0\leq d\leq2$, $0\leq e\leq2$, $0\leq f\leq2$, $0\leq g\leq10$, $0\leq h\leq5$, $1\leq o\leq2$, $1\leq p\leq5$, $1\leq x\leq2$, and $1\leq y\leq5$.

2. The light emitting device of claim 1, wherein the orthosilicate based phosphor comprises $((Br,Sr,Ca)_{1-x}(Pb,Cu)_x)_2SiO_4$:Eu,B, wherein B is at least one element selected from the group consisting of Bi, Sn, Sb, Sc, Y, La, Ce, Pr, Nd, Pm, Sm, Gd, Tb, Dy, Ho, Er, Tm, Yb, and Lu; x ranges from 0 to 1; and Eu and B range from 0 to 0.2.

3. The light emitting device of claim 1, wherein the orthosilicate based phosphor emits light in a wavelength range of 505 nm to 605 nm depending on the composition of the orthosilicate based phosphor.

4. The light emitting device of claim 1, wherein the alkaline earth metal sulfide based phosphor has a chemical formula of $(Ca,Sr)_{1-x-y}Eu_xC_y(S_{1-z}Se_z)$,
   wherein C is at least one element selected from the group consisting of Mn and Pb; x ranges from 0.0005 to 0.1; y ranges from 0 to 0.5; and z ranges from 0 to 1.

5. The light emitting device of claim 4, wherein the alkaline earth metal sulfide based phosphor comprises $(Ca,Sr)_{1-x-y}Eu_xPb_yS$, wherein x ranges from 0.0005 to 0.01, and y ranges from 0 to 0.5.

6. The light emitting device of claim 5, wherein the alkaline earth metal sulfide based phosphor emits light in a wavelength range from 600 nm to 660 nm.

7. The light emitting device of claim 1, wherein the alkaline earth metal sulfide based phosphor comprises $A_{x-a}Eu_aGeS_z$, wherein A is at least one element selected from the group consisting of Ca and Sr; z=x+2; x ranges from 2 to 5; and a/x ranges from 0.0005 to 0.02.

8. The light emitting device of claim 1, wherein the at least one orthosilicate based phosphor emits light in a green wavelength range.

9. The light emitting device of claim 1, wherein the light emitting diode emits light in a wavelength range from 420 nm to 480.

10. The light emitting device of claim 1, further comprising:
    a body, the light emitting diode being disposed on the body; and
    a molding portion for sealing the light emitting diode disposed on the body,
    wherein the molding portion comprises the orthosilicate based phosphor and the alkaline earth metal sulfide based phosphor.

11. The light emitting device of claim 10, wherein the body comprises one of a substrate, a heat sink, and a lead terminal.

12. The light emitting device of claim 1, further comprising an ultraviolet light emitting diode for emitting ultraviolet rays, wherein at least one of the orthosilicate based phosphor and the alkaline earth metal sulfide based phosphor emits light in response to excitation by the ultraviolet rays.

13. A general lighting source, comprising:
a light emitting diode to emit blue light; and
at least one orthosilicate based phosphor to emit light in a green to yellow region; and
an alkaline earth metal sulfide based phosphor to emit light in a red region,
wherein the at least one orthosilicate based phosphor and the alkaline earth metal sulfide based phosphor are disposed on the light emitting diode,
wherein the color rendering of the general lighting source corresponds to a white light spectrum, and
wherein the orthosilicate based phosphor comprises $a(M^{I}O).b(M^{II}O).c(M^{III}A).d(M^{III}_2O).e(M^{IV}_2O_3).f(M^{V}_oO_p).g(SiO_2).h(M^{VI}_xO_y)$ wherein $M^{I}$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^{V}$ is at least one element selected from the group consisting of Ge, V, Nd, Ta, W, Mo, Ti, Zr and Hf; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in ranges of $0<a2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$, and $1 \leq y \leq 5$.

14. A liquid crystal display (LCD) backlight unit, comprising:
a light emitting diode to emit blue light; and
at least one orthosilicate based phosphor to emit light in a green to yellow region; and
an alkaline earth metal sulfide based phosphor to emit light in a red region,
wherein the at least one orthosilicate based phosphor and the alkaline earth metal sulfide based phosphor are disposed on the light emitting diode,
wherein the color reproduction range of the LCD backlight unit corresponds to a white light spectrum, and
wherein the orthosilicate based phosphor comprises $a(M^{I}O).b(M^{II}O).c(M^{III}A).d(M^{III}_2O).e(M^{IV}_2O_3).f(M^{V}_oO_p).g(SiO_2).h(M^{VI}_xO_y)$, wherein $M^{I}$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^{V}$ is at least one element selected from the group consisting of Ge, V, Nd, Ta, W, Mo, Ti, Zr and Hf; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in ranges of $0<a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$, and $1 \leq y \leq 5$.

15. A light flash device, comprising:
the general lighting source of claim 13; and
a color rendering index (CRI) of at least 90.

16. An alkaline earth metal sulfide based phosphor, comprising:
$(Ca,Sr)_{1-x-y}Eu_xM_y(S_{1-z}Se_z)$,
wherein M is at least one element selected from the group consisting of Mn and Pb; $0.0005 \leq x \leq 0.1$; $0 < y \leq 0.5$; and $0 \leq z \leq 1$.

17. The alkaline earth metal sulfide based phosphor of claim 16, wherein the phosphor comprises $(Ca,Sr)_{1-x-y}Eu_xPb_yS$, wherein $0.0005 \leq x \leq 0.01$ and $0 < y \leq 0.5$.

* * * * *